(12) United States Patent
Baugher

(10) Patent No.: US 11,001,494 B2
(45) Date of Patent: May 11, 2021

(54) MULTI-ZONE MICROSTRUCTURE SPRING

(75) Inventor: Jeffrey Paul Baugher, Dayton, OH (US)

(73) Assignee: DUALITY REALITY ENERGY, LLC, Aiken, SC (US)

( * ) Notice: Subject to any disclaimer, the term of this patent is extended or adjusted under 35 U.S.C. 154(b) by 0 days.

(21) Appl. No.: 13/135,037

(22) Filed: Jun. 23, 2011

(65) Prior Publication Data
US 2012/0328860 A1   Dec. 27, 2012

(51) Int. Cl.
*B81B 3/00*   (2006.01)

(52) U.S. Cl.
CPC ...... *B81B 3/007* (2013.01); *B81B 2203/0163* (2013.01); *B81B 2203/0376* (2013.01); *Y10T 29/49609* (2015.01); *Y10T 428/24983* (2015.01)

(58) Field of Classification Search
CPC ......... B81B 3/00; B81B 3/007; B81B 3/0072; B81B 3/0018; B81B 3/0035; B81B 3/0062; H01H 59/00
USPC ........ 428/217; 251/129.01, 129.06; 257/415; 337/333, 396
See application file for complete search history.

(56) References Cited

U.S. PATENT DOCUMENTS

| | | | |
|---|---|---|---|
| 3,940,637 A | 2/1976 | Ohigashi | |
| 5,216,490 A * | 6/1993 | Greiff et al. | 73/514.35 |
| 5,344,117 A * | 9/1994 | Trah et al. | 251/11 |
| 6,118,250 A | 9/2000 | Hutchison et al. | |
| 6,168,395 B1 | 1/2001 | Quenzer et al. | |
| 6,309,077 B1 | 10/2001 | Saif et al. | |
| 6,828,887 B2 * | 12/2004 | Kubby et al. | 335/78 |
| 7,188,931 B2 | 3/2007 | Cabal et al. | |
| 7,195,393 B2 | 3/2007 | Potter | |
| 7,450,797 B2 | 11/2008 | German et al. | |

(Continued)

OTHER PUBLICATIONS

Popescu et al., Buckled Membranes for Microstructures, 1994, IEEE review, pp. 188-192.*

(Continued)

*Primary Examiner* — Joanna Pleszczynska
(74) *Attorney, Agent, or Firm* — Peloquin, PLLC; Mark S. Peloquin, Esq.

(57) ABSTRACT

A method to create a multi-zone microstructure spring includes releasing a buckling layer from a substrate, wherein the buckling layer displaces into a curved shape after the releasing. The buckling layer is displaced, relative to the substrate, through at least one of a first zone, a second zone, and a third zone, wherein the buckling layer provides positive stiffness in the first zone, zero stiffness in a second zone, and negative stiffness in a third zone, and the buckling layer must pass through the first zone to reach the second zone and the buckling layer must pass through the second zone to reach the third zone. A multi-zone microstructure spring includes a substrate and a buckling layer. The buckling layer has a surface area. The buckling layer has a positive stiffness in a first zone, zero stiffness in a second zone, and a negative stiffness in a third zone. The buckling layer must pass through the first zone to reach the second zone and the buckling layer must pass through the second zone to reach the third zone. The buckling layer is connected to the substrate. The microstructure includes an elastic connection. The elastic connection is in contact with the buckling layer over a fraction of the buckling layer's surface area.

41 Claims, 12 Drawing Sheets

(56) References Cited

U.S. PATENT DOCUMENTS

| | | | |
|---|---|---|---|
| 7,667,375 B2 | 2/2010 | Berkcan et al. | |
| 7,839,058 B1 | 11/2010 | Churchill | |
| 7,919,362 B2* | 4/2011 | Bolis | B81C 1/00333 |
| | | | 361/824 |
| 8,614,518 B2 | 12/2013 | Li et al. | |
| 9,076,961 B2 | 7/2015 | Baugher | |
| 9,085,454 B2 | 7/2015 | Baugher | |
| 2005/0046541 A1* | 3/2005 | Fouillet | 337/333 |
| 2005/0134149 A1 | 6/2005 | Deng et al. | |
| 2006/0006484 A1 | 1/2006 | Seneviratne et al. | |
| 2006/0175937 A1 | 8/2006 | Clingman | |
| 2007/0092180 A1 | 4/2007 | Hashimura et al. | |
| 2007/0188136 A1 | 8/2007 | Oh | |
| 2007/0278600 A1* | 12/2007 | Zhan et al. | 257/415 |
| 2008/0136292 A1 | 6/2008 | Thiesen | |
| 2008/0202845 A1 | 8/2008 | Klein et al. | |
| 2009/0272200 A1 | 11/2009 | Frahnow et al. | |
| 2010/0003575 A1* | 1/2010 | Schaevitz et al. | 429/34 |
| 2010/0171393 A1 | 7/2010 | Pei | |
| 2010/0301699 A1 | 12/2010 | Zhang | |
| 2012/0017978 A1 | 1/2012 | Doraiswami et al. | |
| 2012/0169064 A1 | 7/2012 | Hoffman et al. | |

OTHER PUBLICATIONS

Dr. IR. P. Boeraeve, Introduction to the Finite Element Method, Jan. 2010, p. 23 and pp. 34-36 (68 pages total length), Institut Gramme—Liege.

Notification of Transmittal of The International Search Report and Written Opinion for Application PCT/US2012/000309, International Filing Date Jul. 5, 2012 (5 pages).

Written Opinion of The International Searching Authority for Application PCT/US2012/000309, International Filing Date Jul. 3, 2012 (5 pages).

* cited by examiner

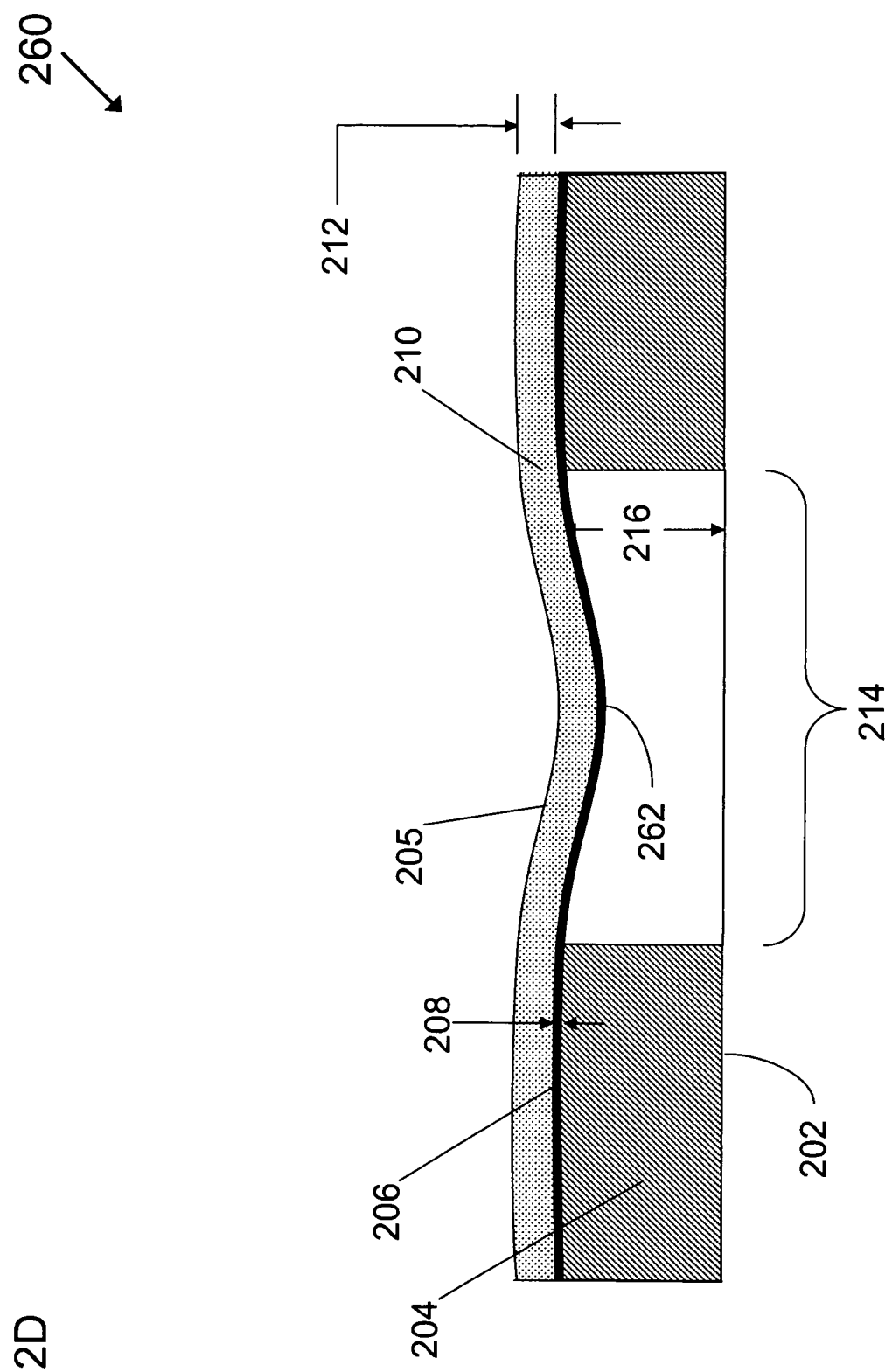

MULTI-ZONE MICROSTRUCTURE SPRING

GOVERNMENT LICENSE RIGHTS

The U.S. Government has a paid-up non-exclusive license in this invention. Research leading to this invention was funded by the New Electronic Warfare Specialists Through Advanced Research by Students (NEWSTARS) program.

BACKGROUND OF THE INVENTION

1. Field of Invention

The invention relates generally to micro-electro-mechanical systems (MEMS) and or micro-opto-electro-mechanical systems (MOEMS), and more specifically to apparatuses and methods used to create multi-zone springs in MEMS or MOEMS devices.

2. Art Background

Devices made using MEMS and MOEMS routinely require elements to provide various functionalities, such as stiffness. MEMS and MOEMS elements that provide stiffness have traditionally been obtained from a spring having a positive spring constant or stiffness. Springs such as; straight beam suspensions, tether wires, meander springs, etc. are used to suspend elements used in MEMS and MOEMS devices. Such springs are characterized by positive stiffness. Designing elements for MEMS and MOEMS devices using only positive stiffness elements is limiting. All of this can present problems.

Design of MEMS and MOEMS elements requires the characterization of the force verses displacement behavior of a device. Traditionally, such characterization was undertaken through the use of pressurized gases, thermal heating, atomic force microscopes, inertial movements, etc. Such devices and methods associated therewith have been inadequate to completely characterize MEMS and MOEMS stiffness elements. This can present a problem.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 2D illustrates a second stable state of a buckled membrane multi-zone microstructure spring, according to embodiments of the invention.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Apparatuses and methods are described for creating a multi-zoned microstructure spring. In one or more embodiments, a spring with positive, zero, and negative stiffness is made using a buckled membrane on a microstructure. In one or more embodiments, pseudo point loads are applied to a buckled membrane layer.

Multi-zoned microstructure springs described in this description of embodiments can be used with micro-electro-mechanical systems (MEMS) devices and/or micro-opto-electro-mechanical systems (MOEMS) devices, or user defined devices that can incorporate aspects of both MEMS and MOEMS devices. Embodiments of the invention are not limited by the type of device used in conjunction therewith and those of skill in the art will recognize that a device can be user defined and embodiments of the invention can be used with devices that do not yet exist. Embodiments of the invention are not limited by the device used therewith. A non-limiting list of devices includes: gyroscopes, inertial sensors, gravitational sensors, accelerometers, seismic sensors, high-G sensors, pressure sensors, mirrors, tunable focal point mirrors, interferometric modulator displays, optical switches, optical cross connects, tunable lasers, etc.

In all of the figures contained in this description of embodiments, geometrical elements are presented to illustrate concepts and parts of various microstructures. In so doing, geometrical elements such as: thickness, lengths, displacements, and shapes are shown which are not to scale. These geometrical elements have been chosen to facilitate understanding within the confines of the paper on which the illustrations are presented; therefore, relative proportions and absolute dimensions should not be inferred therefrom. Additionally, in the figures that follow, a finite horizontal extent of substrates and layers is shown such that only a single buckled membrane is illustrated in any given figure. Those of skill in the art will recognize that the substrates can extend horizontally to encompass many buckled membranes on a single substrate. No limitation is intended, and the finite extent of the substrate and single buckled membrane is intended to preserve clarity in the illustrations.

Figure 1A:
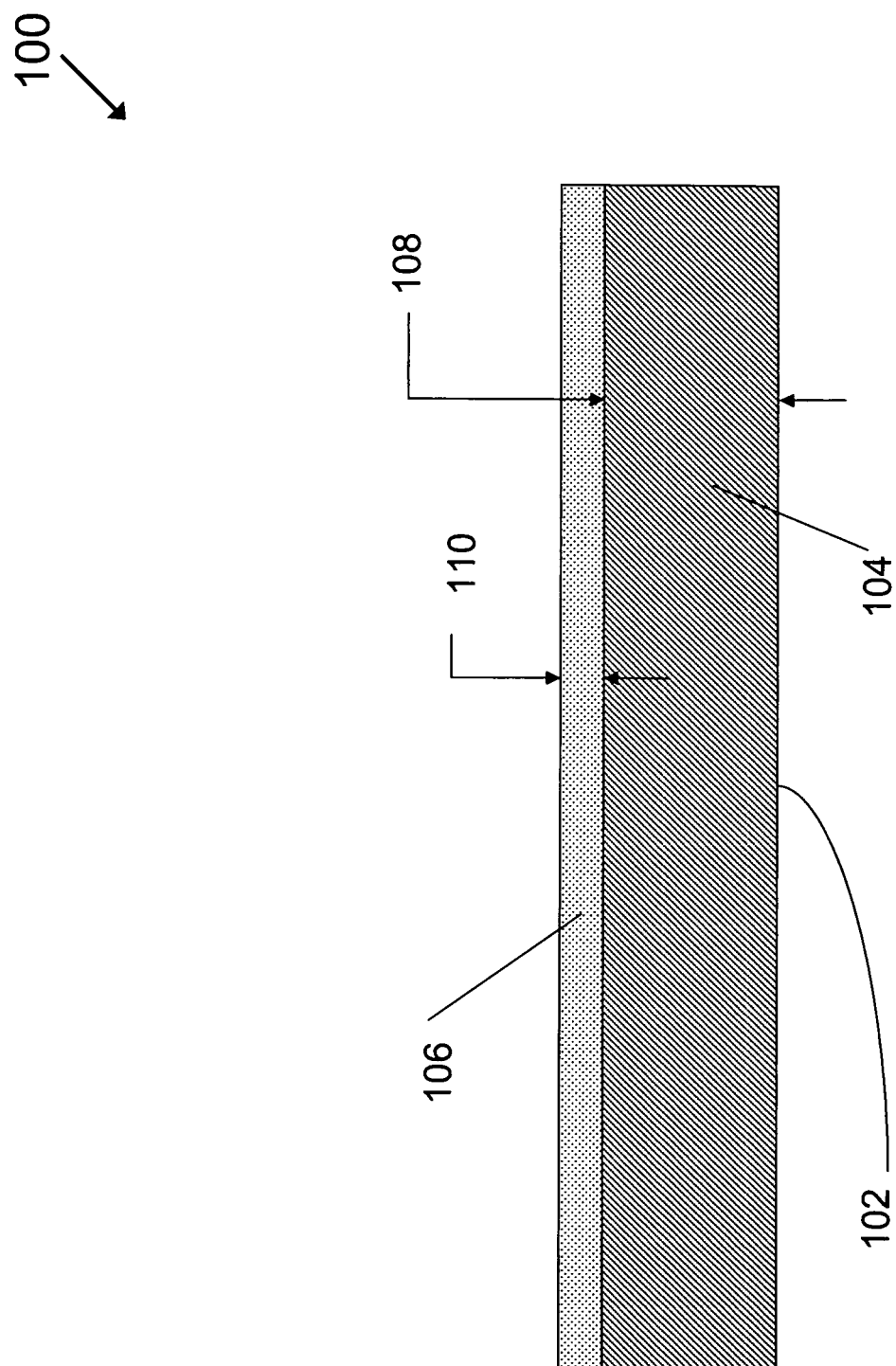
FIG. 1A illustrates a cross-sectional view of a multilayer microstructure, according to embodiments of the invention.

FIG. 1A illustrates, generally at 100, a cross-sectional view of a multilayered microstructure, according to embodiments of the invention. With reference to FIG. 1A, the multi-layered microstructure 102 has a substrate 104, with a thickness indicated at 108. The substrate 104 can be made from a semiconductor material such as silicon. A buckling layer is illustrated at 106, with a thickness indicated at 110. In the view shown in 100, the buckling layer 106 has not released from the substrate 104. The buckling layer 106 can be made of a variety of materials such as silicon dioxide, silicon nitride, etc. selected such that buckling is promoted in the final structure after processing.

In one or more embodiments, the buckling layer 106 can be made from a plurality of layers (sub-layers), as described below in the figures that follow, or the buckling layer can be a monolayer. An important property of the materials selected for the buckling layer and the substrate is that a compressive stress should be developed in the buckling layer relative to the substrate. This is accomplished by different methods in various embodiments, and in some embodiments it is accomplished by arranging for the coefficient of thermal expansion of the buckling layer to be less than the coefficient of thermal expansion of the substrate. Or in the case of a multilayered buckling layer, at least one layer of the sub-layers has a coefficient of thermal expansion that is less than the coefficient of thermal expansion of the substrate.

The buckling layer and its sub-layers can be prepared from an inorganic material such as silicon, silicon dioxide in any of its forms (polycrystalline, microcrystalline or amorphous) silicon germanium, silicon nitride, silicon carbide, diamond, carbon, titanium nitrite, a metallic material such as for example, titanium, gold, copper, aluminum, or alloys thereof, an organic material such as for example, a photosensitive resin such as benzocyclobutene (BCB), parylene, polydimethylsiloxane (PDMS), polyethylene terephthalate (PET), poly-para-xylylene, etc. The buckling layer can be made by any known means or by yet unknown means, the exact way in which the buckling layer is made does not limit embodiments of the invention.

Some non-limiting examples of how a buckling layer can be formed by means known to those of skill in the art are, but are not limited to; thin film deposition, film lamination, spin definition, spraying organic materials, ion implantation, etc. Thin film deposition can be performed by chemical vapor deposition (CVD), low pressure chemical vapor deposition (LPCVD), plasma enhanced chemical vapor deposition (PECVD), physical vapor deposition (PVD), electrolysis, epitaxy, thermal oxidation, and vacuum deposition.

Figure 1B:
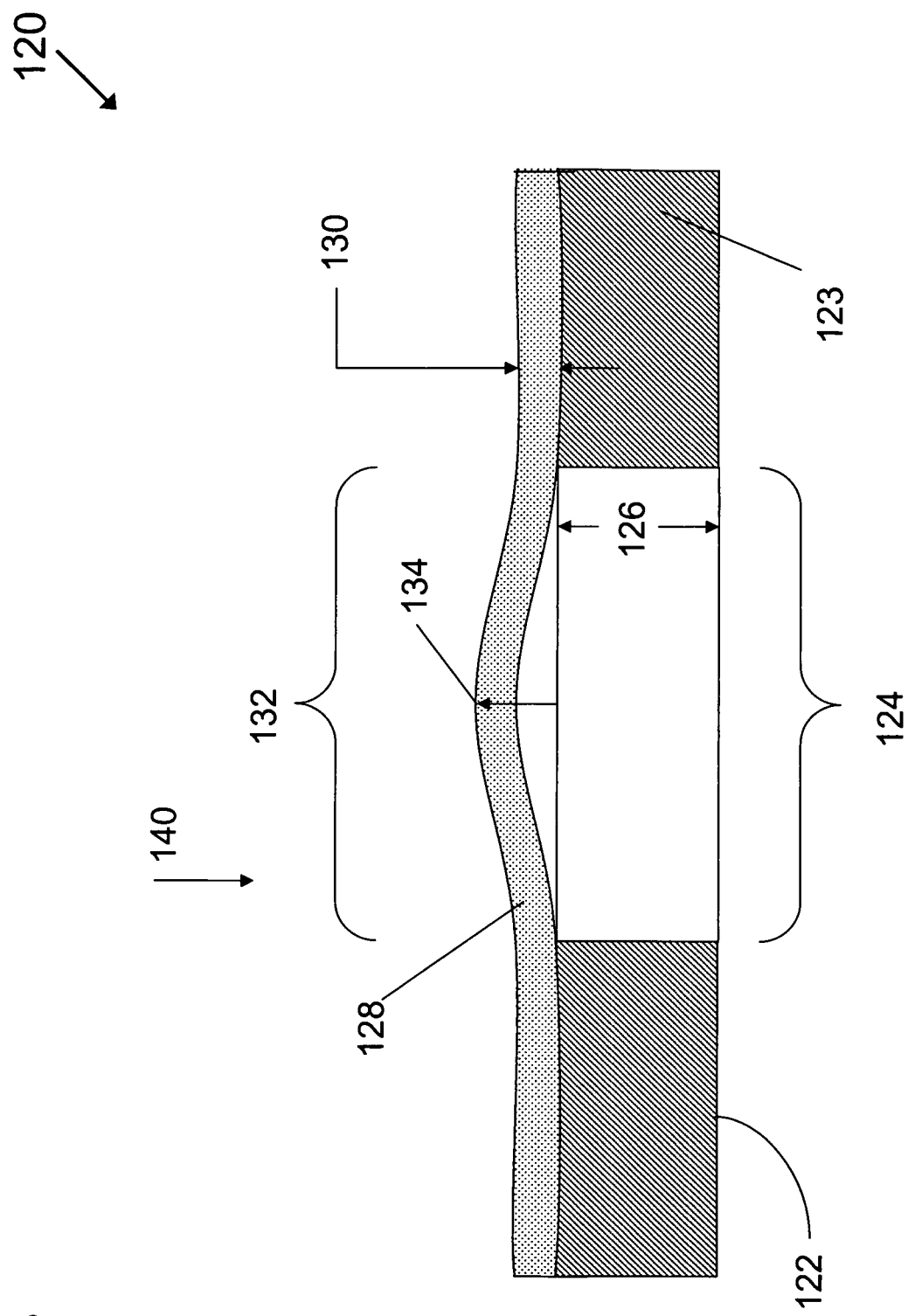
FIG. 1B illustrates a cross-sectional view of a buckled layer within a microstructure, according to embodiments of the invention.

FIG. 1B illustrates, generally at 120, a cross-sectional view of a buckled layer within a microstructure, according to embodiments of the invention. With reference to FIG. 1B, a microstructure 122 has a substrate 123 and a buckling layer 128. A region having a width indicated by 124 is patterned and etched to a depth shown as 126. Removal of substrate 123, from the region 124, causes buckling layer 128 to release from a flat planar orientation as illustrated by 106 (FIG. 1A) to the curved shape as illustrated by 128 (FIG. 1B). The buckling layer 128 develops a maximum displaced height indicated by 134. The buckling layer 128 has a horizontal extent indicated by 132. Note that the horizontal extent 132 can be less than the extent of the region 124. The relationship between the horizontal extent 132 and the region 124 depends on the thickness of the buckling layer, the material properties, the magnitude of the compressive stress, and the dimensions and geometry of the projected shape of a buckling layer. In one non-limiting example, a horizontal extent 132 (850 µm) was 85% of the length of the region 124 (1000 µm). A top view 140 of the buckling layer 128 is illustrated in 140 (FIG. 1C) for a variety of projected shapes.

Figure 1C:
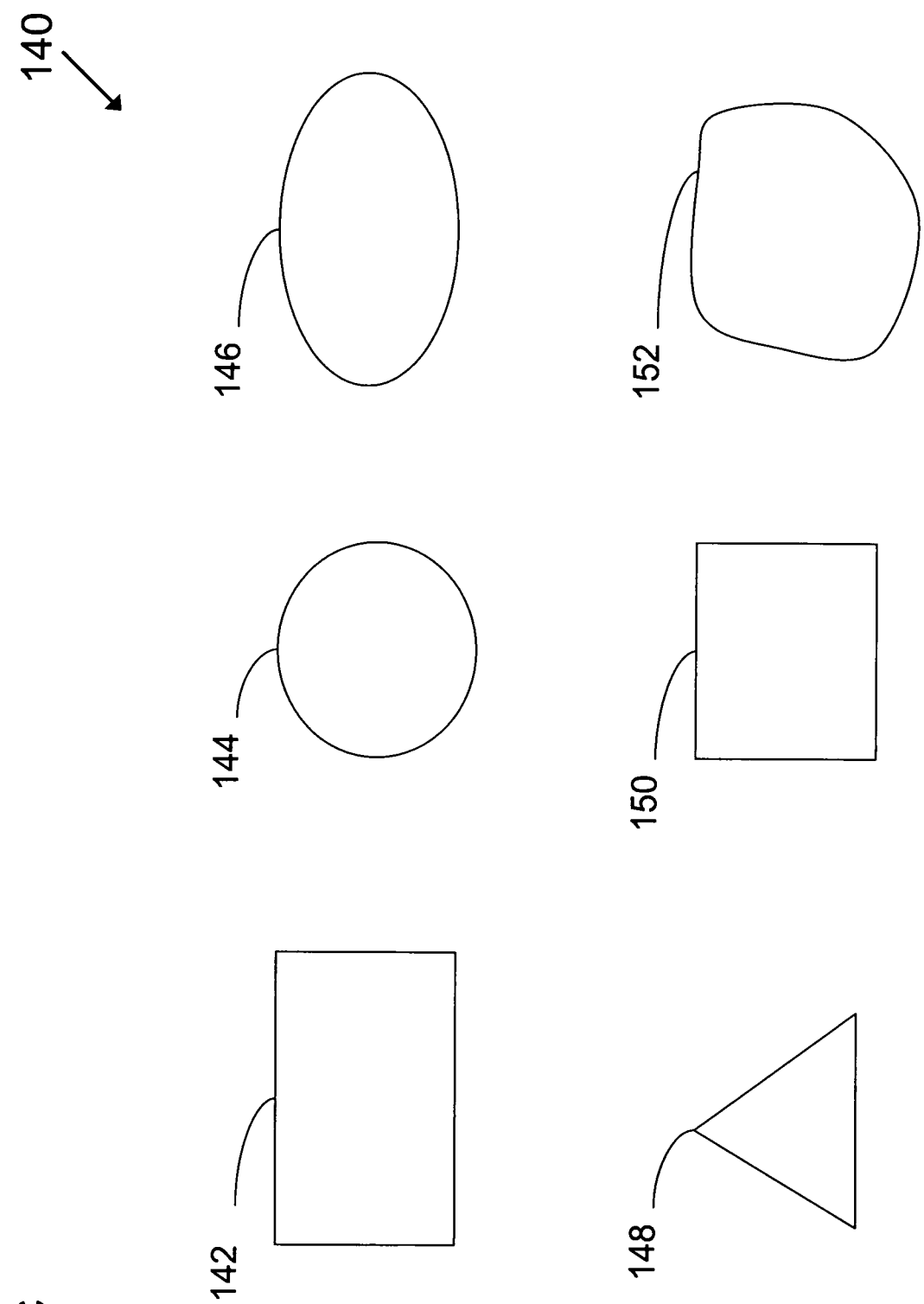
FIG. 1C illustrates various projected areas of buckling layers within a microstructure, according to embodiments of the invention.

FIG. 1C illustrates, generally at 140, various projected areas of buckling layers within a microstructure, according to embodiments of the invention. With reference to FIG. 1C, a released buckled shape can have any type of projected area. The shape of the projected area depends on the patterning that was employed in order to release a buckling layer over an area. A rectangular shape is indicated at 142, a round shape is indicated at 144, and an oval shape is indicated at 146. A triangular shape is indicated at 148, a square shape is indicated at 150, and a general user defined shape is indicated at 152.

Figure 2A:
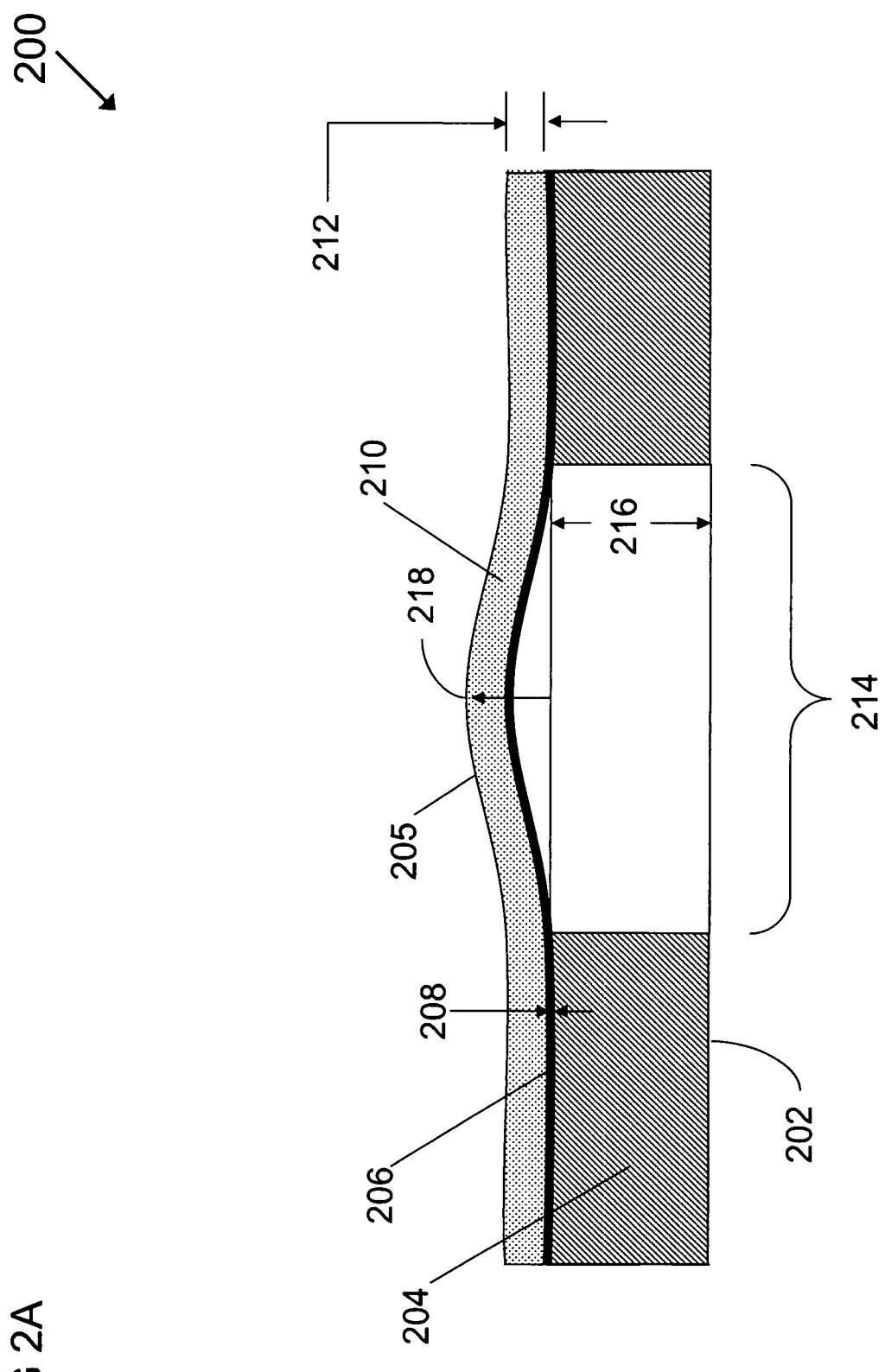
FIG. 2A illustrates a cross-sectional view of a multilayer buckling layer within a microstructure, according to embodiments of the invention

FIG. 2A illustrates, generally at 200, a cross-sectional view of a multilayer buckling layer within a microstructure, according to embodiments of the invention. In one embodiment, a silicon-on-insulator (SOI) wafer 202 was patterned to create a matrix of buckled membranes (only one is shown in the figure for clarity). In this example, an N-type silicon substrate 204 has a thickness of 400 micrometer (µm) indicated at 216. A silicon dioxide layer 206, having a thickness 208 of 2 µm was thermally grown and sandwiched between the substrate 204 and a top layer 210 also referred to as a device layer having a thickness 212 of 5 µm and made from the same material as the substrate 204. The bottom of the substrate was patterned over an area 214 and etched to a depth of 400 µm, thereby removing the substrate from beneath the silicon dioxide layer 206.

Various methods can be used to etch the substrate 204. For example, a layer of silicon dioxide (not shown for clarity) was deposited on the bottom of the wafer 202 followed by a layer of photo resist (also not shown for clarity). The photo resist was then lithographically patterned and developed using standard micromachining techniques. A Buffered Oxide Etch was then used to etch through the silicon dioxide layer and then Deep Reactive Ion Etching (DRIE) was used to remove silicon selectively from beneath the silicon dioxide layer 206. Other techniques can be used such as an anisotropic wet etch using Tetramethylammonium Hydroxide (TMAH). Other micromachining techniques can be used; embodiments of the invention are not limited by the choice of micromachining techniques.

After removal of the substrate 204, over the area 214, the silicon doxide/device layer 206/210 releases to form a buckling layer 205 with two sub-layers. This is the first of two stable states for the buckling layer. The other or second stable state is referred to as a "popped through" position and is as illustrated below in FIG. 2D. In this example, the resulting buckled membrane 205 had a projected area which was square in shape with dimensions of 1 millimeter (mm) on edge. A resulting maximum deflected height 218 is approximately 25.2 µm.

Figure 2B:
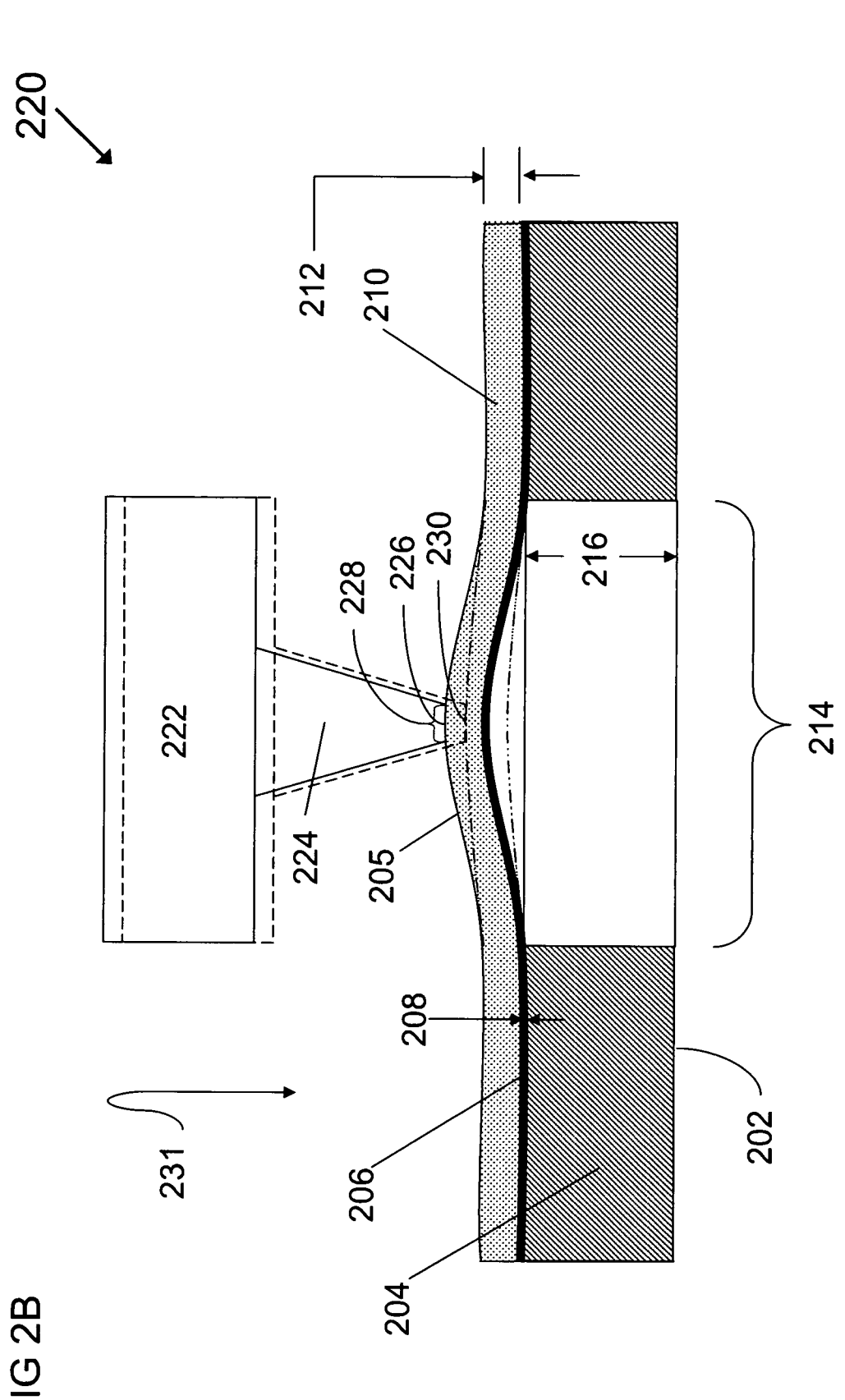
FIG. 2B illustrates contacting a buckled microstructure membrane with a pseudo point load, according to embodiments of the invention.

FIG. 2B illustrates, generally at 220, contacting a buckled microstructure membrane with a pseudo point load, according to embodiments of the invention. Referring to FIG. 2B, a calibrated micro Newton (µN) force sensor 222 is used to apply a pseudo point load to the buckled membrane 205 over a contact area 226. In the experiment resulting in the measurement shown below in FIG. 2C, a force sensor from FemtoTools model FT-S270 was used. This force sensor, mounted to a piezoelectric actuator with a translation range of 20 µm, is capable of applying loads in the micro Newton range (µN). Force sensor 222 has an actuator 224. The actuator 224 has a contact pad 228 which applies the load to the buckled membrane 205 over the contact area 226. The contact area 226 is the portion of the buckled membrane 205 that is directly under the contact pad 228. The contact area 226 is much smaller than the surface area of the buckled membrane 205. The dimensions of the contact pad are 50 μm by 50 μm. It is important to note that the force sensor 222 and the actuator 224 are used to apply a controlled displacement (along with a corresponding application of force) to the buckled membrane 205. The controlled displacement is used to determine a load the buckled membrane applies in response to the controlled displacement. The methods described above provide an ability to characterize the physical behavior of a MEMS structure or a MOEMS structure which is superior to exposing the entire surface of such structures to a uniform load through for example pressure exerted by a fluid or a gas.

Figure 2C:
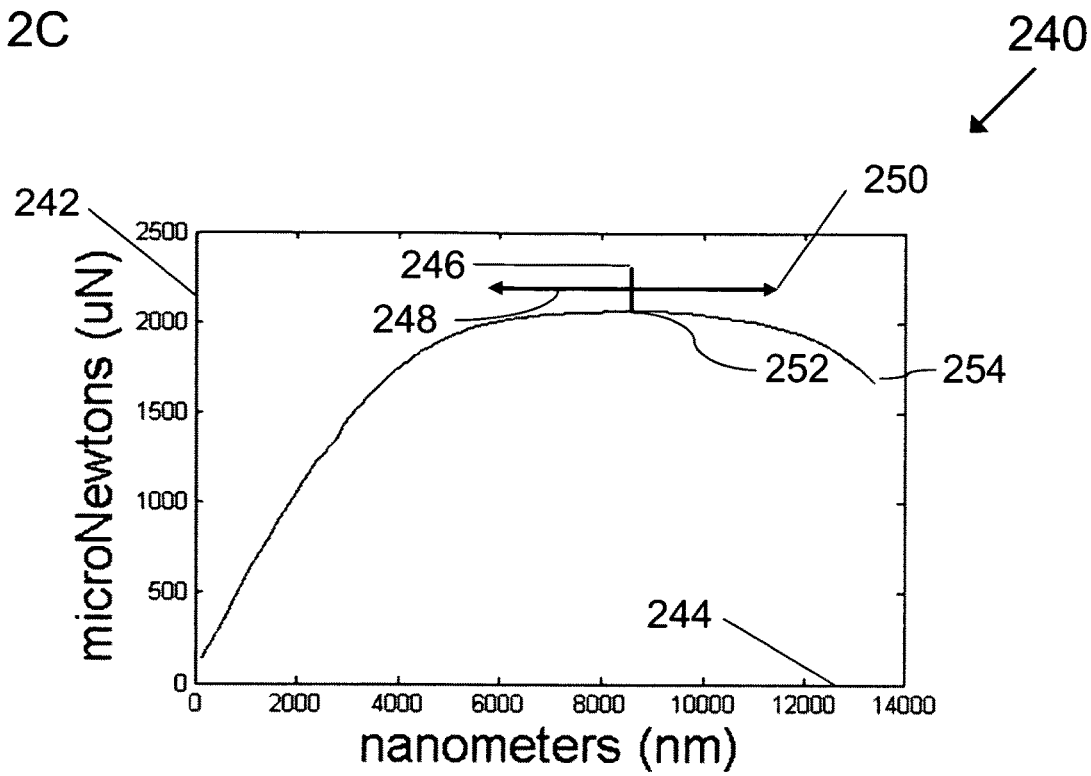
FIG. 2C illustrates a force displacement curve for a multi-zone microstructure spring, according to embodiments of the invention.
Figure 2C:
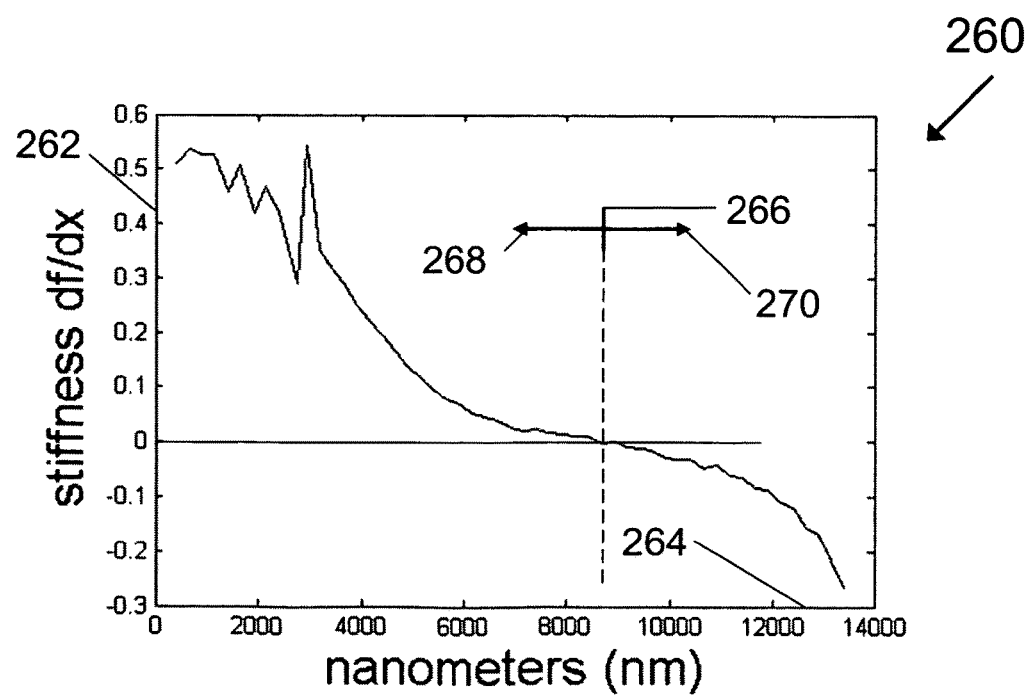

During the measurement procedure that resulted in the measurement presented in FIG. 2C, the force sensor actuator 224 (FIG. 2B) applies a load to the buckled membrane 205, which causes the buckled membrane 205 to translate in the direction indicated by an arrow 231. One such subsequent position associated with the translation of the actuator 224 and the buckled membrane 205 is illustrated by the dashed lines indicating the displaced position of the actuator and membrane and a point 230. The point 230 shows the location of the actuator tip-buckled membrane interface at one point during the measurement procedure. Following the procedure of applying an increasing displacement to the buckled membrane 205 the measured force verses displacement curve reveals a multi-zoned spring as illustrated in FIG. 2C. This multi-zoned spring has a force displacement curve which corresponds to a stiffness profile which is initially positive, transitions through zero and then becomes negative. Further application of force results in a large deflection of the buckled membrane to a second stable state with curvature that is opposite that of the first stable state. The second stable state is illustrated below in conjunction with FIG. 2D.

FIG. 2C illustrates, generally at 240, a force-displacement relationship for the multi-zone microstructure spring of FIG. 2A and FIG. 2B, and a corresponding stiffness-displacement relationship, generally at 260, according to embodiments of the invention. With reference to FIG. 2C and 240, force is plotted on the vertical axis 242 in micro Newtons (μN) and displacement is plotted on the horizontal axis 244 in nanometers. A corresponding stiffness-displacement relationship is plotted in 260 with stiffness plotted on the vertical axis 262 with units of kiloNewtons/meter and displacement plotted on the horizontal axis 264 with units of nanometers. The force displacement relationship 240 reveals a multi-zone microstructure spring, characterized by three zones.

A first zone, indicated by 248 and 268, the positive stiffness zone, is characterized by increasing force with increasing displacement of the buckled membrane. A second zone, indicated by, 246 and 266, the zero stiffness zone, is characterized by a constant force-displacement condition. A third zone 250 and 270, the negative stiffness zone, is characterized by decreasing force with increasing displacement. As used in this description of embodiments, the term "zone" can imply a point or a region. The extent or lack of extent of a "zone" is determined by the particular physical structure. As such, in some cases, the zero stiffness zone will exist as a point. No limitation is implied by the use of the term "zone" to characterize the physics of the multi-zone microstructure spring.

When a displacement illustrated at 254 is reached, the buckled membrane quickly translates away from the force sensor actuator 224 to assume its second stable state as shown at 262 in FIG. 2D.

Figure 3A:
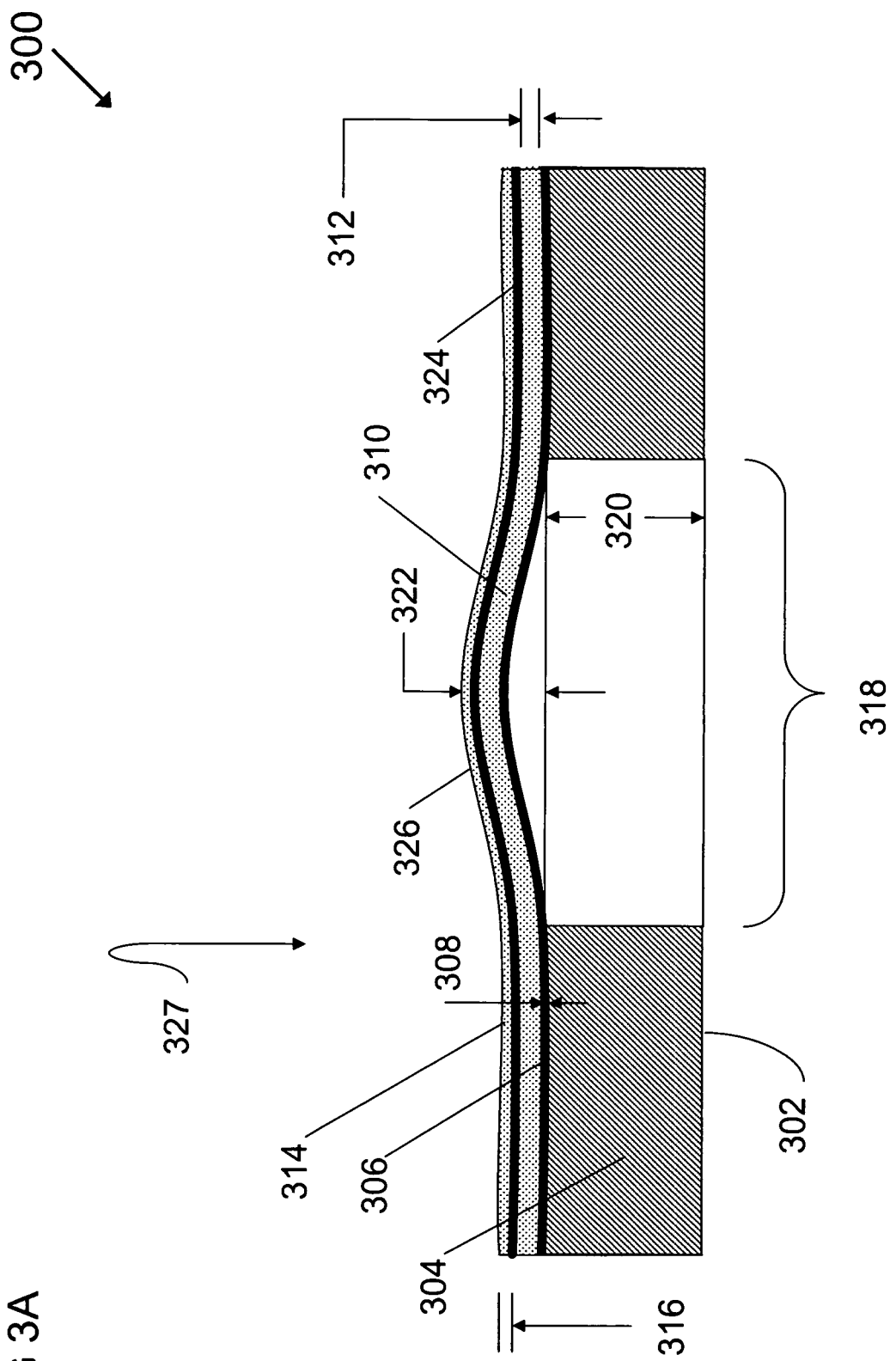
FIG. 3A illustrates a cross-sectional view of a buckled multi-layered membrane within a microstructure, according to embodiments of the invention.

FIG. 3A illustrates, generally at 300, a cross-sectional view of a buckled multi-layered membrane within a microstructure, according to embodiments of the invention. Similar to the microstructure of FIG. 2A, in one embodiment, a silicon-on-insulator (SOI) wafer 302 was patterned to create a matrix of buckled membranes. In this example, an N-type silicon substrate 304 has a thickness of 400 micrometer (μm) indicated at 320. A silicon dioxide layer 306, having a thickness 308 of 2 μm was thermally grown and sandwiched between the substrate 304 and a layer 310. The layer 310 has a thickness 312 of 5 μm and is made from the same material as the substrate 204. Next a 500 angstrom thick titanium layer 324 was evaporated to the silicon layer 310. A 3000 angstrom thick gold layer was evaporated on top of the titanium layer. The bottom of the substrate was patterned over an area 318 and etched to a depth of 400 μm; thereby removing the substrate from beneath the silicon dioxide layer 306.

Similar to the etching applied to the microstructure of FIG. 2A, various methods can be used to etch the substrate 304, prior to release of a buckling layer 326. For example, a layer of silicon dioxide (not shown for clarity) was deposited on the bottom of the wafer 302 followed by a layer of photo resist (also not shown for clarity). The photo resist was then lithographically patterned and developed using standard micromachining techniques. A Buffered Oxide etch was then used to etch through the silicon dioxide layer and then Deep Reactive Ion Etching (DRIE) was used to remove silicon selectively from beneath the silicon dioxide layer 306. Other techniques can be used such as an anisotropic wet etch using Tetramethylammonium Hydroxide (TMAH). Other micromachining techniques can be used as well; embodiments of the invention are not limited by the choice of micromachining techniques.

After removal of the substrate 304, over the area 318, the buckling layer 326 (which includes layers 306, 310, 324, and 314) releases to form a buckling layer 326 having four sub-layers. In this example, the resulting buckled membrane 326 has a projected area which was square in shape with dimensions of 1 millimeter (mm) on edge, with a predominantly circular curved shape buckling out of the horizontal plane of the substrate. A resulting maximum deflected height 322 is approximately 18.5 μm.

Figure 3B:
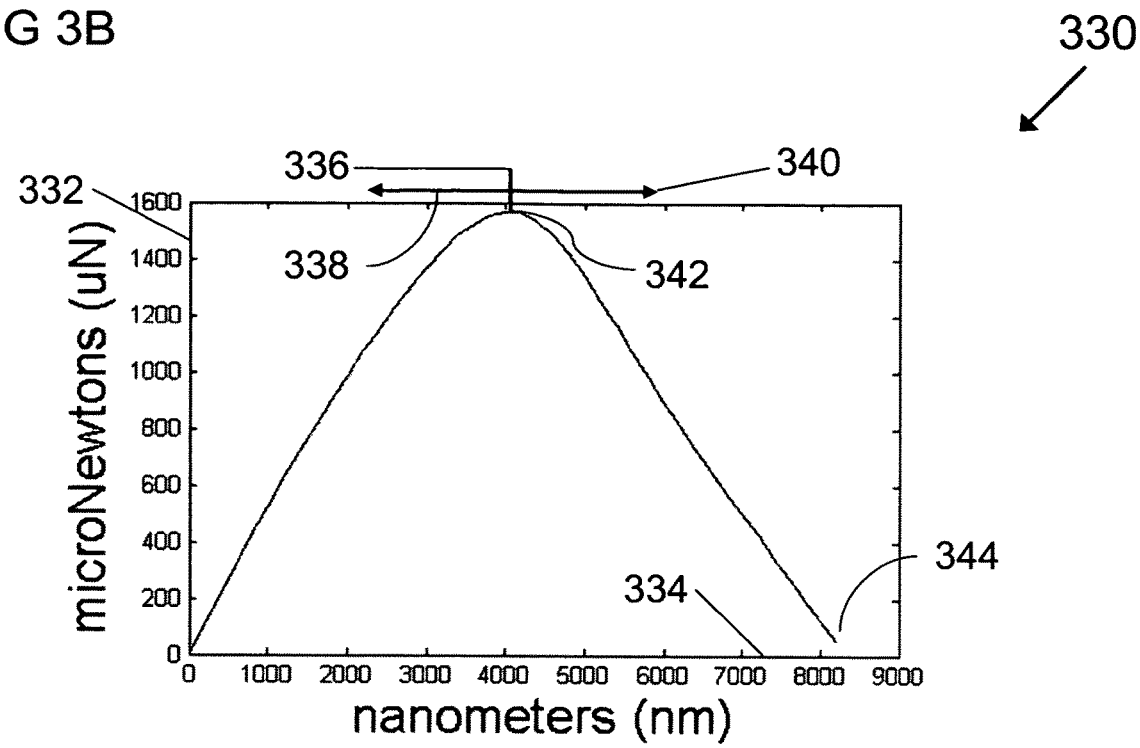
FIG. 3B illustrates a force displacement curve for a multi-zone microstructure spring, according to additional embodiments of the invention.
Figure 3B:
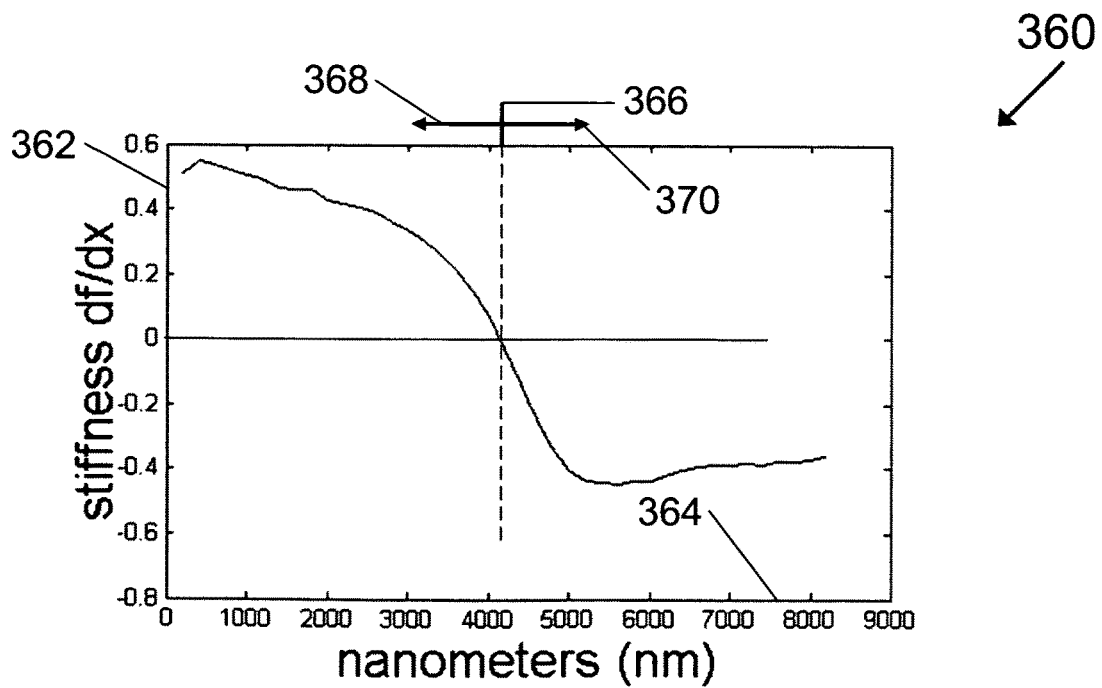

During the measurement procedure that resulted in FIG. 3B, the force sensor actuator 224 (shown in FIG. 2B but not shown in FIG. 3A for clarity) applies a load to the buckled membrane 326 (FIG. 3A) which causes the membrane to translate in the direction indicated by an arrow 327 (FIG. 3A). As described above in conjunction with FIG. 2B, the procedure results in force and displacement being recorded as the buckled membrane is translated by application of the pseudo point load applied by the force transducer actuator. Subsequent positions associated with the translation of the buckled membrane and the force transducer actuator are not shown for clarity. The procedure applied to the buckled membrane 326 reveals a multi-zoned spring as illustrated in FIG. 3B. This multi-zoned spring has a force displacement curve which corresponds to a stiffness profile which is initially positive, transitions to zero and then becomes negative. Further application of force results in a large deflection of the buckled membrane to a second stable state with curvature that is opposite that of the first stable state.

FIG. 3B illustrates, generally at 330, a force-displacement relationship for the multi-zone microstructure spring of FIG. 3A, and a corresponding stiffness-displacement relationship, generally at 360, according to embodiments of the invention. With reference to FIG. 3B at 330, force is plotted on the vertical axis 332 with units of micro Newtons (μN) and displacement is plotted on the horizontal axis 334 with units of nanometers. A corresponding stiffness-displacement relationship is plotted in 360 with stiffness plotted on the vertical axis 362 with units of kiloNewtons/meter and displacement plotted on the horizontal axis 364 with units of nanometers. The force displacement relationship 330 reveals a multi-zone microstructure spring characterized by three zones.

A first zone indicated by 338 and 368, the positive stiffness zone, is marked by increasing force with increasing displacement of the buckled membrane. A second zone indicated by 336 and 366, the zero stiffness zone, is characterized by a constant force-displacement condition. A third zone 340 and 370, the negative stiffness zone, is characterized by decreasing force with increasing displacement. The zero stiffness zone 336/366 can be a point or a region. No limitation is implied by the use of the term "zone" to characterize the physics of the microstructure spring.

When the displacement of the buckled membrane approaches the end of the negative stiffness zone, as indicated by 344, the buckled membrane quickly translates away from the force sensor actuator 224 to assume its second stable state which is qualitatively shown at 262 in FIG. 2D.

The addition of the metal layers, i.e., 500 angstroms of titanium 324 and 3000 angstroms of gold 314 has increased the linearity of both the positive stiffness zone and the negative stiffness zone as illustrated by the measurements presented in FIG. 3B. In various embodiments, a substantially linearized negative stiffness spring is obtained from a buckled membrane within a microstructure. Such devices have three zones for operation, which are selectable based on an initial displacement from a rest position of the buckled membrane.

Figure 4:
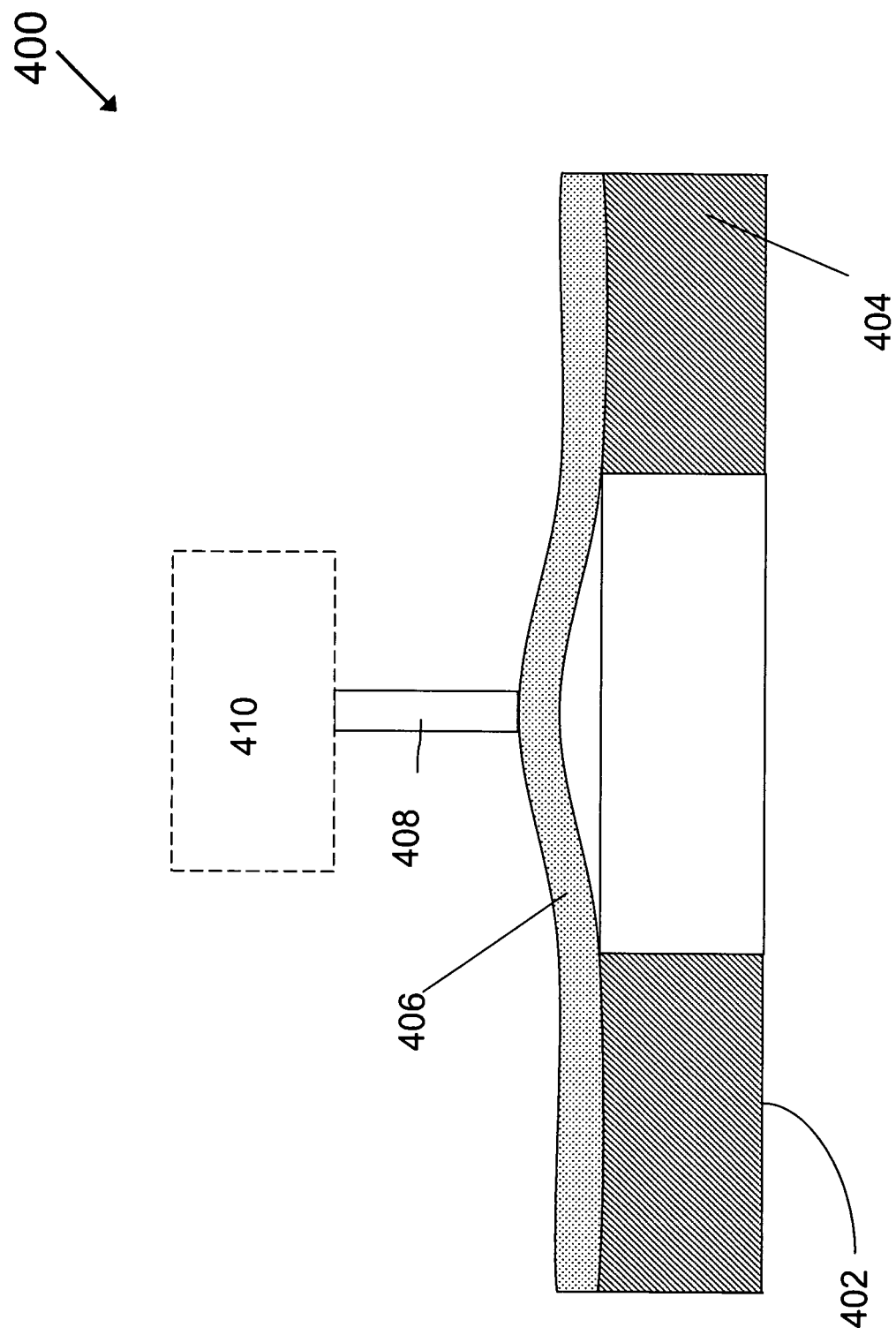
FIG. 4 illustrates contacting a buckled microstructure membrane with a pseudo point load, according to other embodiments of the invention.

FIG. 4 illustrates, generally at 400, contacting a buckled microstructure membrane with a pseudo point load, according to other embodiments of the invention. With reference to FIG. 4, a microstructure 402 has a substrate 404 and a buckled membrane 406 that has been released therefrom. Attached to the membrane 406 is a first end of an elastic connection 408. The other end of the elastic connection 408 is optionally attached to a device 410. The buckled membrane 406 can provide a stiffness element to which the device 410 is mounted. Thus, the buckled membrane 406 modifies the combined stiffness between the device 410 and the substrate 404. The elastic connection can be a column or can take on different shapes in various embodiments. In some embodiments it is an actuator of an instrument such as a force transducer.

The device 410 can be any of the devices previously described above. Such as a micro-electro-mechanical electrical systems (MEMS) devices and/or micro-opto-electro-mechanical systems (MOEMS) devices, a user defined device, or a device that can incorporate aspects of both MEMS and MOEMS devices.

The system represented in FIG. 4 can be tuned to provide vibration isolation to the device 410. Elastic connection 408 resembles a single column as illustrated in FIG. 4; however those of skill in the art will recognize that additional columns can be employed.

In various embodiments a preload can be applied to a buckled membrane, FIG. 2C and FIG. 3B illustrate one form of pre-load applied by the elastic connection 408 and the device 410 to the buckled membrane 406. A pre-load will shift the resulting spring constant presented by the buckled membrane to the structure in contact with the buckled membrane. This is useful when tuning a vibration isolation device because it allows the stiffness of the system to be chosen.

Figure 5:
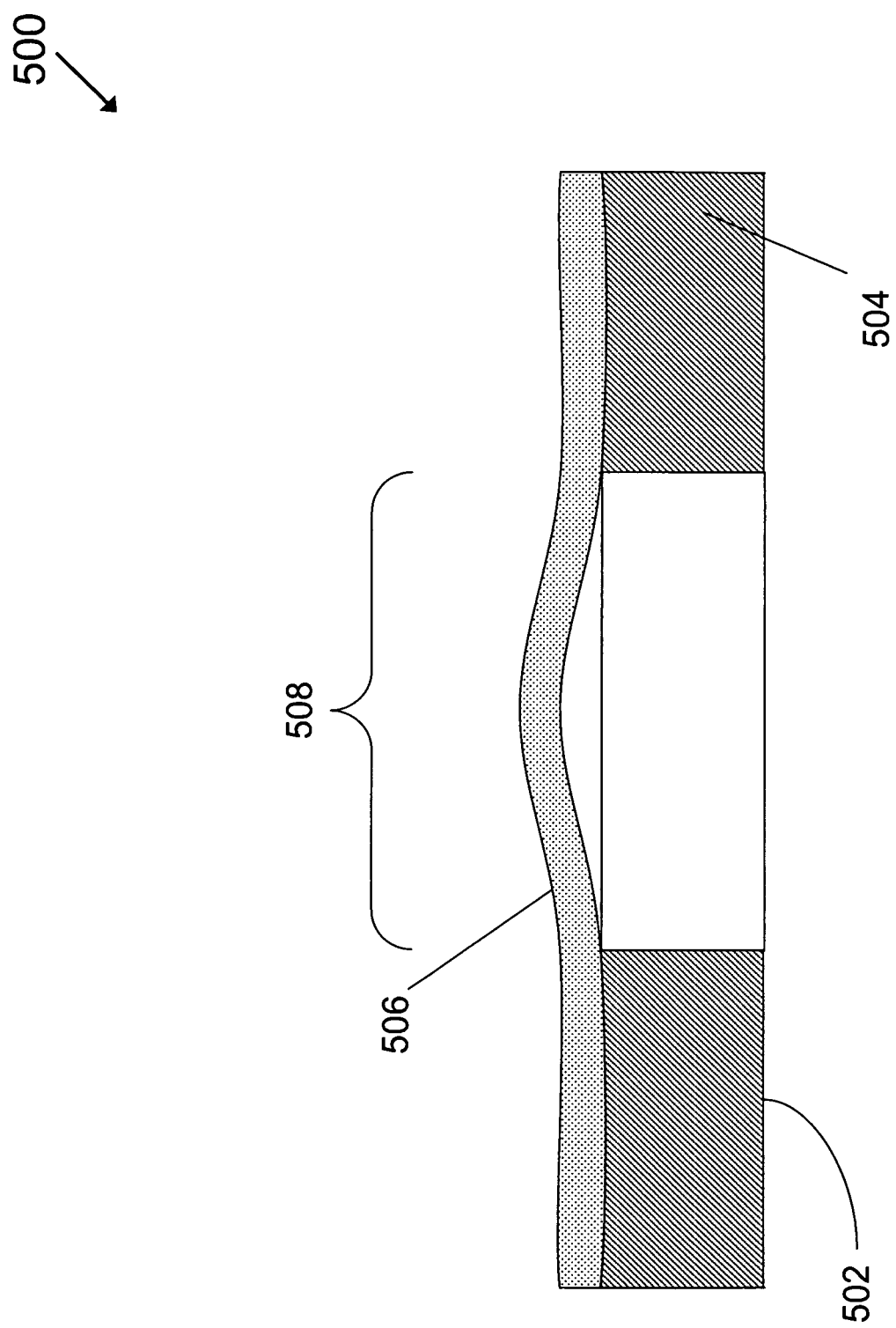
FIG. 5 illustrates a cross-sectional view of a buckled layer within a microstructure, according to additional embodiments of the invention.

FIG. 5 illustrates, generally at 500, a cross-sectional view of a buckled layer within a microstructure, according to additional embodiments of the invention. With reference to FIG. 5, buckling of a layer can be obtained by localized ion implantation into the layer. Ions implanted during ion implantation induce a compressive stress in the buckling layer. The compressive stress induces buckling, which results in a release of a buckling layer into a curved shape that functions as a multi-zoned microstructure spring. The magnitude of the compressive stress induced in the layer depends on the dose selected and the types of ions used. Heat treatment can be applied at approximately 200 degrees C. to trigger release of the buckling layer. 506 shows the buckling layer after release into a curved shape. Note that the buckling layer 506 and the substrate 504 can be the same material; different coefficients of thermal expansion within layers is not required in order to release a buckling layer via ion implantation. Thus, in the example of FIG. 5 both the substrate and the buckling layer can be made from silicon.

Ion implantation can also be used to release a buckling layer when the buckling layer has a coefficient of thermal expansion that is larger than the coefficient of thermal expansion of the substrate. Formation of a layer with a coefficient of thermal expansion which was larger than the coefficient of thermal expansion of the substrate would not result in release of the buckling layer since the buckling layer would be in a state of tension. Ion implantation is used to overcome the state of tension and to create a state of compression, which will result in release of the buckling layer.

Many variations in microstructures can exist and many different materials can be used for the substrate and buckling layers. Therefore, depending on the material used for the substrate and the material used for the desired buckling layer, the species to be implanted via ion implantation will be selected to achieve appropriate compressive stress within the material's lattice structure.

An example of a buckling layer having a coefficient of thermal expansion that is greater than the coefficient of thermal expansion of a substrate is a buckling layer made from silicon nitride $Si_3N_4$, having a coefficient of thermal expansion of 3.4×10-6 mm/K which can be released from a substrate of silicon having a coefficient of thermal expansion of 2.6×10-6 mm/K via ion implantation. Similarly, a buckling layer can be made from alumina $Al_2O_3$ and can be released from a silicon substrate.

Figure 6:
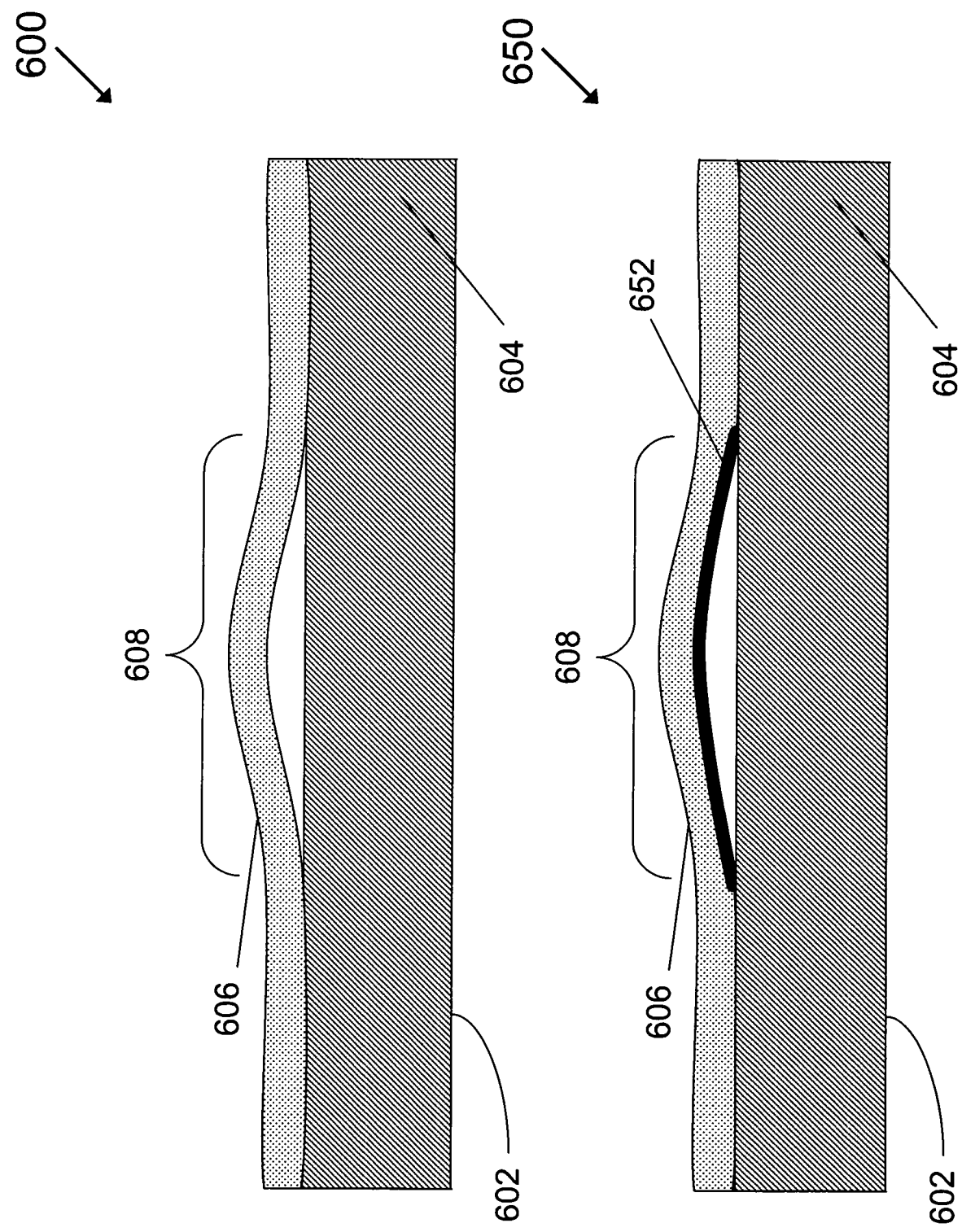
FIG. 6 illustrates a cross-sectional view of a buckled layer within a microstructure, according to additional embodiments of the invention.

FIG. 6 illustrates, generally at 600, a cross-sectional view of a buckled layer within a microstructure, according to additional embodiments of the invention. Referring to FIG. 6, a buckling layer 606 is illustrated that has reduced adhesion to a substrate 604 over a region 608. Outside of the region 608, the buckling layer 606 has adhesion sufficient to overcome any differential compressive stress residing within the buckling layer. Adhesion between the buckling layer 606 and 604 over the area 608 is too low to prevent buckling.

Referring to 650 in FIG. 6, release of a buckling layer can be accomplished by application of a first layer that has limited adhesion with the substrate 604, such as a layer 652. In various embodiments, the layer 652 is made from an organic material which provides less adhesion than the adhesion obtained between the buckling layer 606 and the substrate 604. In various embodiments, the layer 652 can be made from polyethylene terephthalate, parylene, benzocyclobutene, etc. For example, a sub-layer of parylene can be deposited by gas spraying on the substrate, patterned by a photolithography step to limit application to the area where release is desired, i.e., 608. Subsequent application of the buckling layer 606 results in limited adhesion under the area 608. Release of the buckling layer can be accomplished by any of the methods previously described, resulting in the buckled membrane 606.

Adhesion between a buckling layer 606 and the substrate 604 can be decreased by a process step(s) in the manufacture of the microstructure for example by an application or a deposition of an intermediate layer (not shown in FIG. 6 at 600), such as by application of liquids e.g., a photosensitive resin such as Unity 2203P from Promerus, LLC.

Depending on the substrate and intended use of the microstructure, buckling can be induced, during deposition of a second sub-layer on top of a first sub-layer where the second sub-layer has a high coefficient of thermal expansion than the coefficient of thermal expansion of the first sub-layer. A vacuum heat treatment at 300 degrees C. for several minutes can facilitate release of the buckling layer.

Alternatively, for a liquid sub-layer of propylene carbonate or water, degradation of adhesion can occur from evaporation at temperatures around 100 degrees C., resulting in release of the buckling layer.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. A microstructure that modifies a combined stiffness between a substrate and a mechanically connected device, comprising:

a substrate; and
a multi-zone microstructure spring, the multi-zone microstructure spring, comprising:
  a buckling layer, the buckling layer having a plane, the buckling layer further comprising:
    at least two coextensive sub-layers, a first of the at least two coextensive sub-layers is a first metal sub-layer, the buckling layer is a buckled membrane that has a surface area and a positive stiffness in a first zone, a zero stiffness in a second zone, and a negative stiffness in a third zone, the buckling layer must pass through the first zone to reach the second zone and the buckling layer must pass through the second zone to reach the third zone, the buckling layer is connected to the substrate and the buckling layer is in a non-zero state of stress;
  an elastic connection, the elastic connection having a first end, a second end, and a first longitudinal axis disposed between the first end and the second end, the first end of the elastic connection is attached to the buckled membrane over a fraction of the surface area, the first longitudinal axis is positioned so that it is not parallel to the plane; and
  a device, the device is suitable for use with the microstructure, the second end of the elastic connection is connected to the device, the elastic connection provides a connection between the device and the buckled membrane, the multi-zone microstructure spring, together with the elastic connection, modifies a combined stiffness between the device and substrate along a first direction, wherein the first direction is not parallel to the plane.

2. The microstructure of claim 1, wherein the device is a micro-electro-mechanical system (MEMS) device.

3. The microstructure of claim 1, wherein the device is a micro-opto-electro-mechanical system (MOEMS).

4. The microstructure of claim 1, wherein the device is an instrument.

5. The microstructure of claim 4, wherein the instrument is a force transducer.

6. The microstructure of claim 1, wherein a linearity of an elastic response of the buckling layer in at least one of the three zones is increased from a first linearity to a second linearity, wherein for the first linearity, the metal sublayer is not included in the buckling layer, and for the second linearity, the metal sublayer is included in the buckling layer.

7. The microstructure of claim 1, wherein the negative stiffness of the buckled membrane reduces the combined stiffness.

8. The microstructure of claim 1, wherein the positive stiffness of the buckled membrane increases the combined stiffness.

9. The microstructure of claim 1, wherein the buckling layer is released from the substrate without etching the substrate beneath the buckling layer.

10. The microstructure of claim 1, wherein a coefficient of thermal expansion of the buckling layer is different from a coefficient of thermal expansion of the substrate.

11. The microstructure of claim 10, wherein the coefficient of thermal expansion of the buckling layer is less than the coefficient of thermal expansion of the substrate.

12. The microstructure of claim 10, wherein the coefficient of thermal expansion of the buckling layer is greater than the coefficient of thermal expansion of the substrate.

13. The microstructure of claim 11, wherein the buckling layer contains silicon dioxide and the substrate is made of silicon.

14. The microstructure of claim 1 wherein a preload is applied to the buckling layer.

15. The microstructure of claim 1, wherein a second of the at least two co-extensive sub-layers is a second metal layer and the first metal layer, and the second metal layer are made from different metals.

16. The microstructure of claim 1, wherein a second of the at least two co-extensive sub-layers comprises silicon dioxide.

17. The microstructure of claim 16, the buckling layer further comprising;
 a third co extensive sub-layer, wherein the third coextensive sub-layer is made from the substrate material.

18. The microstructure of claim 1, the buckling layer further comprising:
 a plurality of non-overlapping buckled membranes.

19. The microstructure of claim 1, wherein a stiffness of the buckled membrane is selected to provide vibration isolation for the device.

20. The microstructure of claim 1, wherein the elastic connection resembles a column.

21. The microstructure of claim 1, further comprising:
 a second elastic connection, the second elastic connection having a first end, a second end, and a second longitudinal axis, the first end of the second elastic connection is attached to the buckled membrane over a fraction of the surface area, the second end of the second elastic connection is connected to the device, the second longitudinal axis is positioned so that it is not parallel to the plane, the second elastic connection provides a second connection between the device and the buckled membrane, the multi-zone microstructure spring modifies the combined stiffness between the device and substrate along a second direction that is not parallel to the plane.

22. The microstructure of claim 1, wherein the elastic connection is in a form of a shape other than a column.

23. A microstructure that modifies a combined stiffness between a substrate and a mechanically connected device, comprising:
 a substrate, the substrate is substantially planar; and
 a multi-zone microstructure spring, comprising:
  a buckling layer, the buckling layer having a plane, the buckling layer further comprising:
   at least two coextensive sub-layers, a first of the at least two coextensive sub-layers is a metal sub-layer, the buckling layer is a buckled membrane that has a surface area and a perimeter, the buckling layer is released from the substrate over the surface area, displacement of the buckling layer is in a direction perpendicular to the plane;
  an elastic connection, the elastic connection having a first end, a second end, and a first longitudinal axis disposed between the first end and the second end, the first end of the elastic connection is attached to the buckled membrane, over a fraction of the surface area, the first longitudinal axis is positioned so that it is not parallel to the plane; and
  a device, the device is suitable for use with the microstructure, the second end of the elastic connection is connected to the device, the elastic connection provides a connection between the device and the buckled membrane, the multi-zone microstructure spring, together with the elastic connection, modifies a combined stiffness between the device and substrate along a first direction, wherein the first direction is not parallel to the plane.

24. The microstructure of claim 23, wherein a stiffness of the buckled membrane is selected to provide vibration isolation for the device.

25. The microstructure of claim 24, wherein a coefficient of thermal expansion of the buckling layer different from a coefficient of thermal expansion of the substrate.

26. The microstructure of claim 25, wherein the coefficient of thermal expansion of the buckling layer is less than the coefficient of thermal expansion of the substrate.

27. The microstructure of claim 25, wherein the coefficient of thermal expansion of the buckling layer is greater than the coefficient of thermal expansion of the substrate.

28. The microstructure of claim 26, wherein the buckling layer contains silicon dioxide and the substrate is made of silicon.

29. The microstructure of claim 24, wherein an out of plane preload is applied to the microstructure to tune the combined stiffness in order to provide vibration isolation to the device.

30. The microstructure of claim 24, wherein the buckling layer is released from the substrate without etching the substrate beneath the buckling layer.

31. The microstructure of claim 24, wherein a thickness and a type of metal of the metal sub-layer are selected to linearize a negative stiffness zone of the combined stiffness.

32. The microstructure of claim 24, wherein a second of the at least two co-extensive sub-layers is a second metal layer and the first metal layer, and the second metal layer are made from different metals.

33. The microstructure of claim 24, wherein a second of the at least two co-extensive sub-layers comprises silicon dioxide.

34. The microstructure of claim 33, the buckling layer further comprising;
 a third coextensive sub-layer, wherein the third coextensive sub-layer is made from the substrate material.

35. The microstructure of claim 24, the buckling layer further comprising:
 a plurality of buckled membranes, wherein each buckled membrane of the plurality occupies a different surface area of the substrate.

36. The microstructure of claim 24, wherein the elastic connection resembles a column.

37. The microstructure of claim 24, further comprising:
 a second elastic connection, the second elastic connection having a first end, a second end, and a second longitudinal axis, the first end of the second elastic connection is attached to the buckled membrane, over a fraction of the surface area, the second end of the second elastic connection is connected to the device, the second longitudinal axis is positioned so that it is not parallel to the plane, the second elastic connection provides a second connection between the device and the buckled membrane, the multi-zone microstructure spring modifies the combined stiffness between the device and substrate along a second direction that is not parallel to the plane.

38. The microstructure of claim 24, wherein the elastic connection is in a form of a shape other than a column.

39. A microstructure that provides vibration isolation to a mechanically connected device, comprising:
 a substrate, the substrate is substantially planar;
 a multi-zone microstructure spring, comprising:

a buckling layer, the buckling layer is a buckled membrane that has a surface area and a perimeter, the buckling layer is released from the substrate over the surface area, displacement of the buckling layer is in a direction perpendicular to a plane of the substrate;

an elastic connection, the elastic connection having a first end, a second end, and a first longitudinal axis disposed between the first end and the second end, the first end of the elastic connection is attached to the buckled membrane, over a fraction of the surface area, the first longitudinal axis is positioned so that it is not parallel to the plane; and a device, the device is suitable for use with the microstructure, the second end of the elastic connection is connected to the device, the elastic connection provides a connection between the device and the buckled membrane to support the device, the multi-zone microstructure spring, together with the elastic connection, modifies a combined stiffness between the device and substrate to reduce vibration imparted by the substrate to the device.

40. The microstructure of claim 39, wherein a stiffness of the buckled membrane is selected to provide vibration isolation for the device.

41. The microstructure of claim 39, wherein the combined stiffness is tuned to a particular value to provide vibration isolation for the device.

* * * * *